United States Patent
Schwarzenbolz (10) Patent No.: US 11,524,310 B2
(45) Date of Patent: Dec. 13, 2022

(54) DEVICE AND METHOD FOR MEASURING A VARNISH JET FOR VARNISHING CIRCUIT BOARDS

(71) Applicant: REHM THERMAL SYSTEMS GMBH, Blaubeuren-Seissen (DE)

(72) Inventor: Manuel David Schwarzenbolz, Blaustein (DE)

(73) Assignee: REHM THERMAL SYSTEMS GmbH, Blaubeuren-Seissen (DE)

( * ) Notice: Subject to any disclaimer, the term of this patent is extended or adjusted under 35 U.S.C. 154(b) by 969 days.

(21) Appl. No.: 16/095,732

(22) PCT Filed: Apr. 25, 2017

(86) PCT No.: PCT/EP2017/059727
§ 371 (c)(1),
(2) Date: Oct. 23, 2018

(87) PCT Pub. No.: WO2017/186678
PCT Pub. Date: Nov. 2, 2017

(65) Prior Publication Data
US 2021/0220856 A1  Jul. 22, 2021

(30) Foreign Application Priority Data
Apr. 25, 2016 (DE) ............... 10 2016 206 995.0

(51) Int. Cl.
*B05B 12/08* (2006.01)
*G01B 11/02* (2006.01)
*H05K 3/00* (2006.01)

(52) U.S. Cl.
CPC .......... *B05B 12/082* (2013.01); *G01B 11/028* (2013.01); *H05K 3/0091* (2013.01)

(58) Field of Classification Search
CPC ... B05B 12/082; G01B 11/028; H05K 3/0091
See application file for complete search history.

(56) References Cited

U.S. PATENT DOCUMENTS

| | | | |
|---|---|---|---|
| 6,457,655 B1 | 10/2002 | Reighard et al. | 239/8 |
| 8,154,711 B1 * | 4/2012 | Scheer | B05B 12/082 356/3.07 |

(Continued)

FOREIGN PATENT DOCUMENTS

| | | |
|---|---|---|
| CN | 1620341 | 5/2005 |
| DE | 19727484 | 2/1999 |

(Continued)

OTHER PUBLICATIONS

International Search Report dated Jun. 26, 2017 in the corresponding PCT application No. PCT/EP2017/059727; 6 pages.

(Continued)

*Primary Examiner* — Michael P LaPage
(74) *Attorney, Agent, or Firm* — Fattibene & Fattibene, LLC; Paul A. Fattibene (57) ABSTRACT

The present invention relates to devices and methods for measuring a varnish jet for a varnishing process for electronic subassemblies. Said devices and methods allow the width and symmetry of the varnish jet to be determined without performing any relative movement between the varnish jet and the sensor.

16 Claims, 7 Drawing Sheets

(56) References Cited

U.S. PATENT DOCUMENTS

| | | | | |
|---|---|---|---|---|
| 2005/0006363 | A1 | 1/2005 | Hsu et al. | 219/130.01 |
| 2005/0023367 | A1 | 2/2005 | Reighard et al. | 239/1 |
| 2005/0115500 | A1* | 6/2005 | Vardelle | B23K 10/006 118/688 |
| 2006/0081039 | A1* | 4/2006 | Scheer | B05B 12/082 73/65.02 |
| 2007/0236693 | A1* | 10/2007 | Prociw | G06T 7/66 356/336 |
| 2007/0251921 | A1* | 11/2007 | Herchen | G01F 1/7086 216/84 |
| 2009/0000391 | A1 | 1/2009 | Dorrmann et al. | 73/861.18 |
| 2010/0271477 | A1 | 10/2010 | Farina et al. | 348/135 |
| 2013/0001315 | A1 | 1/2013 | Butler et al. | 239/1 |
| 2017/0259289 | A1* | 9/2017 | Schoen | B05B 12/082 |
| 2018/0304293 | A1* | 10/2018 | Orla-Jensen | G01N 15/06 |

FOREIGN PATENT DOCUMENTS

| | | |
|---|---|---|
| DE | 60038080 | 3/2009 |
| EP | 1432526 | 6/2004 |
| EP | 1080787 | 3/2011 |
| JP | 2001121042 | 5/2001 |
| SU | 620279 | 8/1978 |
| WO | WO 2010107895 | 9/2010 |
| WO | WO 2015010806 | 1/2015 |

OTHER PUBLICATIONS

English translation of Office Action/Search Report from corresponding Chinese application No. 201780032577.2 dated Jun. 5, 2020; 15 pages.

Office Action/Search Report from corresponding Russian application dated Aug. 5, 2019; 2pages.

Chinese Second Office Action dated Mar. 10, 2021 in counterpart Chinese application No. 201780032577.2, English translation; 7 pages.

European Patent Office action dated Apr. 30, 2021 in counterpart EPO application No. 17 721 567.0; 5 pages.

* cited by examiner

DEVICE AND METHOD FOR MEASURING A VARNISH JET FOR VARNISHING CIRCUIT BOARDS

FIELD OF INVENTION

The present invention relates in general to the measurement of a varnish jet for coating substrates, in particular printed circuit boards in the electronics sector, where it is also referred to as "conformal varnishing", and relates in particular to an optical sensor which is adapted for measuring a varnish jet for coating substrates, in particular printed circuit boards, a measuring device which uses this optical sensor, a varnishing device for substrates, in particular printed circuit boards, which uses this measuring device, a method for determining the width or symmetry of a varnish jet for coating substrates, in particular printed circuit boards, and a method for measuring a varnish jet.

BACKGROUND TO THE INVENTION

In the manufacture of electronic assemblies, the circuit boards are often coated with a protective varnish after being fitted with electronic components. This form of coating is also called "conformal varnishing" because it conforms to the surface structure or topology. During the coating process, certain areas, such as contact points, connector strips, etc., are omitted, so that the coating process must be selective and precise. State-of-the-art liquid discharge systems are known for this purpose, with which a liquid jet is discharged in a certain liquid spray pattern from a nozzle outlet in the direction of a surface to be coated according to a defined varnishing plan. Widely used is a system that uses an applicator that can discharge a fan-shaped liquid jet. A liquid jet shaped in this way is called a curtain, which can be formed by an appropriately shaped nozzle in the applicator, hereinafter referred to as a curtain nozzle, applicator nozzle or simply nozzle. The effective application width of the curtain depends on the supply pressure for the applied liquid, in this case a protective varnish, the nozzle geometry and the application height used, i.e. the distance between the outlet of the curtain nozzle and the surface to be coated.

Before being used in a coating process, the nozzle or liquid curtain must be calibrated, i.e. a pressure must be determined at which the liquid, for example a protective varnish, must be fed to the nozzle in order to achieve a certain width of the liquid curtain or varnish curtain at a certain application height when exiting the nozzle geometry. Furthermore, the symmetry of the varnish curtain must be determined, as the nozzles may have tolerances or become dirty, which can lead to the formation of an asymmetrical liquid jet. The parameters with which the coating process is to take place are determined during the calibration, i.e. at which application height the coating should take place, which supply pressure must be used to achieve a certain curtain width at the desired application height, and it must be determined whether there is an asymmetry of the curtain due to tolerances, wear of the curtain nozzle and possible soiling, so that the defined varnishing plan can be corrected with the positions of the applicator during the coating process to obtain the intended spray pattern. This means that in the event of asymmetry, the varnish curtain is no longer symmetrical to the nozzle orifice and the positioning of the curtain nozzle during the coating process must be corrected according to the asymmetry.

Figure 1:
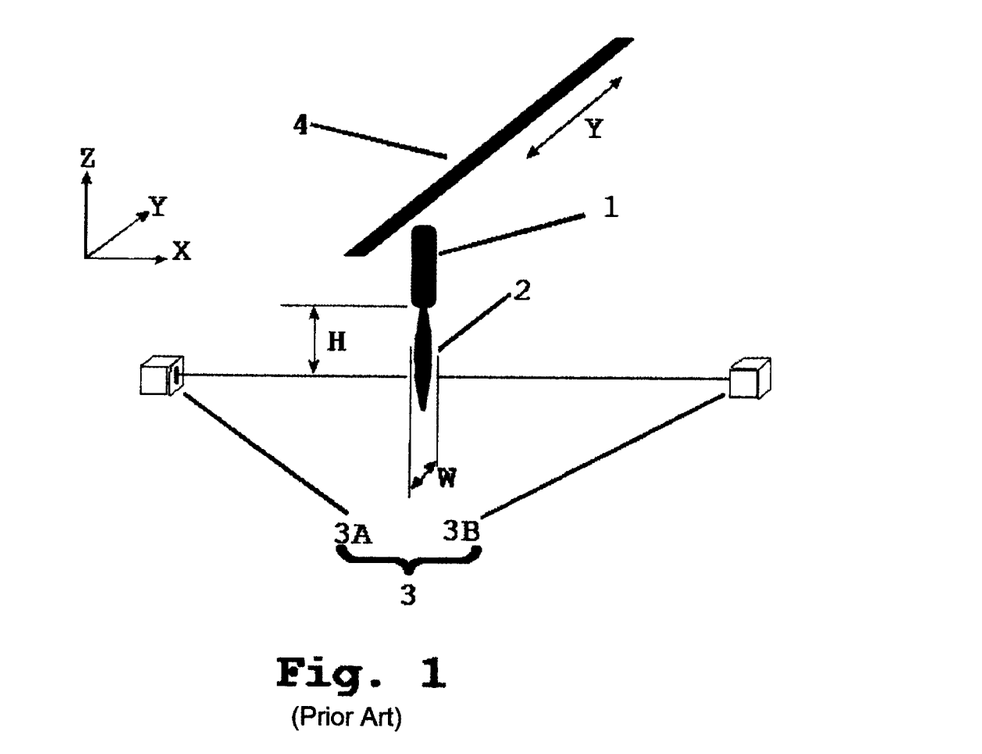
FIG. 1 shows a sensor arrangement for measuring the curtain width according to the state of the art.

For the measuring process or for the measuring of the curtain geometry a measuring station in the varnishing device with an optical sensor is generally used. Such a state-of-the-art measuring arrangement is shown in FIG. 1. In FIG. 1 the reference numeral 1 schematically shows the curtain nozzle, the reference numeral 2 indicates the varnish curtain, the reference numeral 4 indicates a transport device for the curtain nozzle 1, the reference numeral 3 indicates the sensor, the reference numeral H indicates the application height and the reference numeral W indicates the width of the varnish curtain 2. The transport device 4 for the applicator can move the curtain nozzle 1 in the representation selected in FIG. 1 past the sensor in the y-direction. The width direction of the width W of the varnish curtain 2 also extends in the y-direction. The height direction of the application height H extends in the representation selected in FIG. 1 perpendicular to the direction of movement of the transport device 4 in the z-direction. The measuring direction of the sensor 3, which corresponds to the propagation direction of the detector light beam, extends perpendicular to the direction of movement of the transport device 4 (y-direction) and perpendicular to the height direction (z-direction) in the x-direction. The optical sensor consists of an essentially point-shaped light source 3A and a receiver 3B, for example a photodiode. Transmitter and receiver can be arranged as breakers in the form of a light barrier, or transmitter and receiver can also be integrated with each other, whereby the receiver receives the light emitted by the transmitter not directly, but as light reflected at an object. To measure the varnish curtain, the curtain nozzle is first moved into the sensor area. The applicator is then activated and the varnish is dispensed under a preset pressure through the nozzle orifice. While the special nozzle produces the varnish curtain, this special nozzle (curtain nozzle) is guided past the optical sensor at the desired application height. The curtain width at the required application height is determined from the speed of the curtain nozzle relative to the optical sensor as well as the beginning of the interruption or reflection of the light beam.

Measuring systems of this type are described in DE 600 38 080 T2 and EP 1 432 526, for example.

These types of curtain width measurement have the disadvantage that the curtain nozzle must be moved during the measuring process and thus positioning errors of the step motor for the displacement of the curtain nozzle can cumulate and lead to inaccuracies in the determination of the curtain width. Furthermore, the measurement process takes a long time and during the entire movement it may be necessary for varnish to be ejected through the nozzle, resulting in high varnish consumption.

It is desirable to provide a more accurate and faster measuring device. It is therefore an object of the present invention to provide devices and methods with which a varnish jet can be measured and calibrated quickly, precisely and thus cost-effectively for the production of printed circuit boards.

SUMMARY OF THE INVENTION

According to a first aspect of the present invention, the object is solved by an optical sensor adapted to measure a varnish jet for a coating process, in particular a conformal coating process, where the optical sensor comprises: a field of view that has a width that is greater than the maximum expected width of the varnish jet, so that the sensor does not have to be moved relative to the varnish jet during the measurement process; and at least one output through which a signal can be output that corresponds to a width of the varnish jet in the field of view of the optical sensor.

With an optical sensor designed in this way, the width of a varnish jet can be measured quickly and precisely, since no movement of the applicator or the curtain nozzle in the applicator is required, and the measurement result can be picked up at the sensor's measurement output immediately after the sensor is switched on.

According to a second aspect of the present invention, the object is solved by an optical sensor, which is adapted for measuring a varnish jet for a coating process, in particular a conformal coating process, whereby the optical sensor comprises: a field of view that has a width that is larger than the maximum expected width of the varnish jet, so that the sensor does not have to be moved relative to the varnish jet during the measuring process; and at least one output via which a signal can be output that corresponds with a position of a center position of the varnish jet relative to the optical sensor.

The optical sensor thus designed allows the central position of the varnish jet or varnish curtain to be determined without movement of the applicator and with the associated positioning errors. The output of the sensor provides the information in real time and the output and reduces the varnish consumption during the calibration process. This information can then be used to determine the asymmetry of the curtain with very little computational effort.

According to a third aspect of the present invention, the object is solved by an optical sensor which is adapted for measuring a varnish jet for a coating process, in particular a conformal coating process, whereby the optical sensor comprises: a field of view that has a width that is larger than the maximum expected width of the varnish jet, so that the sensor does not have to be moved relative to the varnish jet during the measuring process; at least one output, wherein the optical sensor has a first operating mode and a second operating mode, wherein in the first operating mode a signal can be output via the at least one output which corresponds to a width of the varnish jet in the field of view of the optical sensor, and wherein in the second operating mode a signal can be output via the at least one output (40) which corresponds to a position of a central position of the varnish jet relative to the optical sensor.

The optical sensor thus designed combines the features and benefits of the sensor of the first and second aspect of the present invention and allows easy determination of both the width of a varnish jet and its symmetry without the need for relative movement between the varnish jet and the sensor.

The output of the measured values can be realized in different embodiments.

In one embodiment, the optical sensor has at least two outputs, whereby a signal can be output on the first of the at least two outputs that corresponds to the width of the varnish jet in the field of view of the optical sensor. On the second of the at least two outputs, a signal can be output that corresponds to the position of the center position of the varnish jet relative to the optical sensor. A complete measurement of the varnish jet can thus be carried out quickly, as both parameters are available simultaneously and in real time.

In one embodiment, the optical sensor has an input via which the operating mode can be selected. In this embodiment, only one output is required so that hardware costs can be reduced. If an analog output is used, the optical sensor also permits simple retrofitting of older and simpler coating systems. For example, an analog output can output an analog output signal in the voltage range 0-10 Volt or −5-+5 Volt, or in the current range 0-20 mA or 4-20 mA. These voltage or current ranges can be processed with common detection and evaluation devices.

In order to be able to measure the varnish jet width without moving the varnish applicator, it is advantageous if the optical sensor has a field of view with a width extension that is larger than the maximum expected width of the varnish jet. For example, applicators for a curtain width between 0.3 cm and 2 cm are used in common varnishing systems, so that the field of view of the optical sensor should be in the range of 1 cm to 4 cm, preferably in the range of 3 cm.

In another embodiment, the optical sensor uses light in a wavelength range from 650 nm to 780 nm, preferably in a range around 670 nm. In such a wavelength range, a better contrast is obtained for the transparent varnish used in conformal varnishing in order to perform the measurement. The wavelength range around 670 nm has the advantage that it offers a particularly good compromise between achievable contrast and cost for the light source.

According to a fourth aspect of the present invention, the object is solved by a measuring device that includes the following: the aforementioned optical sensor according to the first to third aspect of the present invention; a positioning device adapted to position a varnish applicator for coating circuit boards with protective varnish; and control means configured to control the positioning device so that the varnish applicator is conveyed to a predetermined measuring position so that a varnish exit from the nozzle orifice of the curtain nozzle in the applicator is positioned at a predetermined application height above the field of view of the sensor and a varnish jet width of the varnish jet can be measured at the predetermined application height.

A measuring device designed in this way can be easily integrated into a varnishing device for printed circuit boards and the width of a varnish jet for a varnish applicator or a curtain nozzle can be measured as part of the varnishing process.

In an embodiment, the measuring device further comprises a varnish supply means, the control means being configured to drive the varnish supply means so that the varnish jet width and the varnish jet symmetry of the varnish jet can be determined at a predetermined supply pressure for the varnish. With a varnish supply means as part of the measuring apparatus, the measuring apparatus is more universally usable, for example as an independent test stand for varnish jet emitting applicators or as an integral part of a varnishing device for printed circuit boards, the control means and varnish supply means of this measuring apparatus being capable of converting the varnishing operation itself in the varnishing device for printed circuit boards.

According to a fifth aspect of the invention, the object is solved by a varnishing device for printed circuit boards comprising the aforementioned measuring device according to the second aspect of the present invention including the aforementioned varnish supply device, as well as additionally a board conveyor and a varnishing section in which the boards are varnished. The positioning device of the measuring device is further configured to position the applicator with the curtain nozzle in the varnishing area and to move it in the varnishing area in such a way that the board is varnished with the defined varnishing plan. Furthermore, the control means of the measuring device in the varnishing device is configured to control the positioning device and the varnish supply device for a varnishing operation using the measured varnish jet width with the associated supply pressure and the measured varnish jet symmetry.

The measuring device integrated in the varnishing device with the inventive sensor makes it possible to selectively coat circuit boards with a protective varnish while leaving special areas free, such as plug connectors and connections. Due to the precise measurement, which is possible with the inventive varnishing device, the varnishing tracks can be set so precisely that no masking work is necessary and nevertheless a uniform protective layer can be achieved at the overlapping points of the tracks while at the same time saving varnish consumption.

According to a sixth aspect of the present invention, the object is solved by a method for determining the width of a varnish jet for varnishing printed circuit boards, which comprises the following steps: moving a varnish applicator to a measurement position of a varnish device for printed circuit boards; supplying varnish under a predetermined pressure to the applicator; sensing the jet width with an optical sensor according to the first to third aspect of the present invention as described above while the varnish applicator is stationary; and outputting a first signal corresponding to the width of the varnish jet.

With this method, the width of a varnish jet or varnish curtain can be determined quickly and precisely. This method can be carried out as a jet width check in between, for example after every or every second, third etc. finished substrate, for example an assembled board. However, the method can also be used for a measuring method in which a supply pressure is determined for a certain jet width.

According to a seventh aspect of the present invention, the object is solved by a method for determining the symmetry of a varnish jet, which comprises the following steps: moving a varnish applicator to a measurement position of a varnishing device for printed circuit boards; supplying varnish under a predetermined pressure to the varnish applicator; detecting a center position of the varnish jet relative to the optical sensor with an optical sensor according to the first to third aspect of the present invention while the varnish applicator is stationary; outputting a second signal corresponding to a position of a center position of the varnish jet relative to the optical sensor; comparing the position of the center position of the varnish curtain with the center position of a nozzle orifice in the varnish applicator; and determining the distance of the two positions as a measure of the asymmetry of the varnish jet.

With this method, the asymmetry of the varnish jet can be quickly and precisely adjusted so that corrections can easily be made to the positioning of the varnish applicator when coating the boards. This procedure can be performed as a symmetry check in between, e.g. after every or every second, third etc. finished substrate, e.g. an assembled board, to determine whether cleaning of the nozzle is necessary or whether the varnishing plan needs to be adjusted. However, the method can also be used for a measuring method in which the symmetry data are determined after determining a supply pressure for a certain jet width.

In a further embodiment of the previously mentioned methods, the varnish applicator is positioned at the measuring position in such a way that a varnish outlet from a nozzle in the varnish applicator is positioned at a specified application height above a field of view of the sensor, and that a varnish jet width and/or a curtain symmetry of the varnish curtain can be measured at the specified application height.

According to an eighth aspect of the present invention, the object is solved by a method for measuring a varnish jet that comprises the steps, (a) setting the supply pressure for the varnish to an initial value;
(b) determining a width of a varnish jet for a desired application height according to the sixth aspect;
(c) comparing the measured varnish jet width with a desired value;
(d) adjusting the supply pressure for the varnish by a predetermined amount if the measured varnish jet width does not correspond to the target varnish jet width;
(e) repeating steps (b) to (d) until the desired varnish jet width is reached; and
(f) storing the value for the supply pressure reached.

With this method, the required supply pressure for the varnish application at a desired application height is obtained quickly and economically.

According to a ninth aspect of the present invention, the object is solved by a method for measuring a varnish jet, which comprises the steps:

(g) determining the asymmetry of the varnish jet according to the seventh aspect; and
(h) storing the asymmetry as a value for an offset between the center position of the varnish jet and the center position of the nozzle orifice on the varnish applicator.

With this method, correction values are obtained for asymmetries in the varnish curtain due to wear and manufacturing tolerances of the curtain nozzle, which can be used for further processing when creating or changing a varnishing plan. This procedure can be applied after the measuring procedure according to the eighth aspect of the invention at hand. However, it can also be used as a symmetry check after the method according to the eighth aspect of the present invention. The stored value can be used later in the creation or correction of the varnishing plan. For example, a zero as a stored value may mean that there is no asymmetry.

According to a tenth aspect of the present invention, the object is solved by a method for measuring a varnish jet that includes the steps:

(i) determining the asymmetry of the varnish jet according to the seventh aspect of the present invention;
(j) comparing the distance between the center position of the varnish jet and the center position of the nozzle orifice on the varnish applicator to a first threshold; and
(k) storing the asymmetry in the form of a value for an offset between the center position of the varnish curtain and the center position of the nozzle orifice on the varnish applicator when the first threshold is exceeded.

In addition to the ninth aspect of the present invention, this method clarifies whether a correction of the varnishing plan would be necessary at all. Depending on the asymmetry determined, it could be determined when the next symmetry check should take place.

In one embodiment, the distance between the position of the center position of the varnish jet and the center position of the nozzle orifice on the varnish applicator can be compared with a second threshold value, and if the second threshold value is exceeded, the varnish applicator can be positioned in a cleaning position and cleaning can be carried out. If the cleaning process fails, the nozzle must be replaced to maintain the quality of the coating.

BRIEF DESCRIPTION OF THE DRAWINGS

In the following, embodiments, further developments, advantages and possible applications of the invention are explained in more detail using the attached Figures. All the features described and/or depicted are, in themselves or in any combination, the subject of the invention, irrespective of their summary in the claims or their back-reference. The content of the claims is also made part of the description. The Figures show:

DETAILED DESCRIPTION OF THE INVENTION

Figure 2:
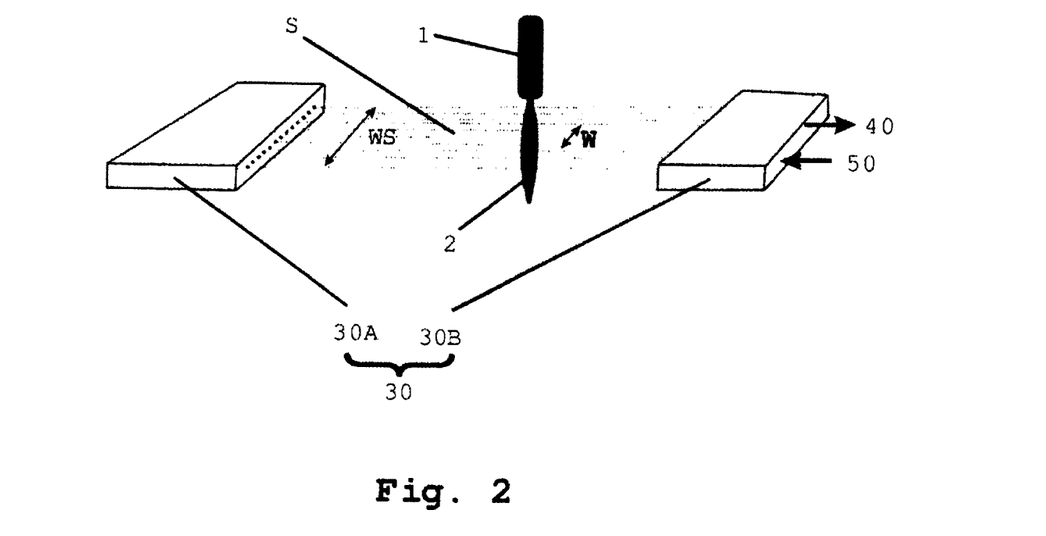
FIG. 2 shows a sensor arrangement for measuring a curtain width according to the present invention.

FIG. 2 shows a schematic representation of an example of a sensor arrangement for measuring the width of a varnish curtain according to the invention. Although the terms "varnish curtain", "curtain width", "curtain symmetry", and "curtain nozzle" are used in the detailed description, it should be understood that these terms are used as examples for illustration in a specific form, and these terms can be replaced by the more general terms and features "varnish jet", "varnish jet width", "varnish jet symmetry", and "varnish applicator".

FIG. 2 schematically shows a curtain nozzle 1, a varnish curtain 2 and a sensor 30 consisting of a transmitter 30A and a receiver 30B. The receiver has an analogue output 40 and a digital input 50. The sensor 30 is shown here as a light barrier array with a transmitter section 30A and a receiver section 30B. For example, the 30A transmitter section may be a linear array of laser diodes, and the 30B receiver section may be a linear array of receiver diodes. However, the special design of the sensor 30 is not important. The inventive advantages result from the sensor structure, with which the entire width of a varnish curtain can be measured and both its width and its asymmetry can be output via at least one output. This function could, for example, also be fulfilled with a laser beam and a receiver diode, whereby the laser beam is formed by means of movable micro-optics and directed onto the photodiode so that, for example, very fast scanning of the varnish curtain can take place. The arrangement as an interrupter system (light barrier principle) with opposite transmitter and receiver, as shown in FIG. 2, is also not necessary. The sensor can also be implemented as an integrated transmission/receiver unit with and without an opposite reflector. Also the representation with a digital input and an analog output is only exemplary. Several outputs can also be used, so that symmetry data and data on the width of the varnish jet can be output simultaneously. It is also possible to have a plurality of inputs or to do without the input. The inputs and outputs can be analog and/or digital. The representation in the Figures should therefore only be regarded as an example of the implementation of the invention.

An essential characteristic of the sensor 30 is that it has a field of view S with an effective width WS that is larger than the width W of the varnish curtain 2, so that the width W of the varnish curtain 2 can be detected without moving the varnish curtain relative to the sensor. When using the same coordinate system as in FIG. 1, the width direction of the width WS of the field of view therefore extends in the y-direction. The width direction of the width W of the varnish curtain 2 also extends in the y-direction. Since the width WS of the field of view S is larger than the width W of the varnish curtain 2, the width W of the varnish curtain 2 can be measured without moving the curtain nozzle 1.

Figure 3:
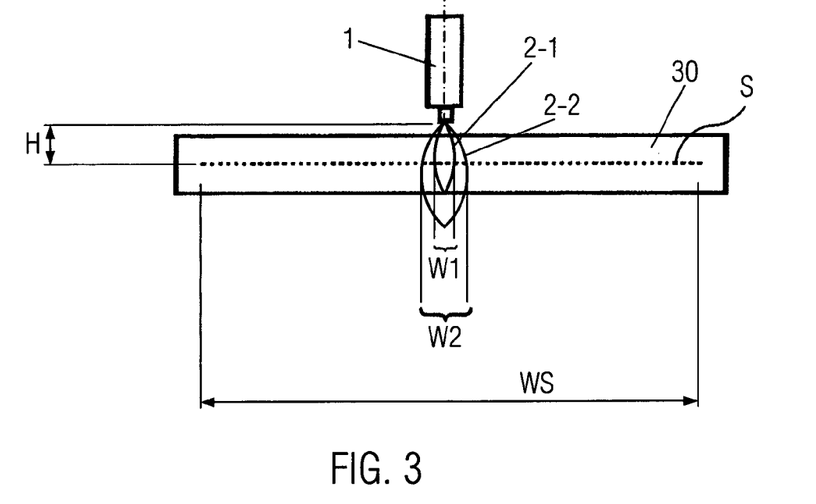
FIG. 3 shows a cross-sectional view of the arrangement of FIG. 2.

FIG. 3 illustrates the effect of different supply pressures for the curtain nozzle 1. FIG. 3 is a cross-sectional view of the 3D view of FIG. 2 with a viewing direction in the x-direction. The reference numeral P indicates the position of the curtain nozzle 1 in the measuring position. In the coordinate system selected by FIGS. 1, 2 and 3, the measuring position P corresponds to a fixed y-coordinate. FIG. 3 shows two different varnish curtains 2-1 and 2-2, which are produced at different supply pressures for the supply of e.g. protective varnish to curtain nozzle 1. In the example shown in FIG. 3, the first varnish curtain 2-1 has a width W1 which is achieved by a first supply pressure. At a second supply pressure greater than the first supply pressure, the second varnish curtain 2-2 reaches a width W2 greater than the first width W1. The width is measured in the field of view S of the sensor 30. The field of view S extends in the y-direction in the coordinate system selected in FIGS. 1 to 3 and has a negligible extension in the height direction (z-direction). The curtain nozzle 1 is located at the selected application height H above the field of view S (z-direction). The widths W1 and W2 are measured in the field of view S of the sensor 30, i.e. on the line of the field of view S. As shown in FIG. 3, the width WS of the field of view S is larger than the widths of the varnish curtain W1 and W2. The width WS of the field of vision S is selected so that it is larger than the maximum expected width W of the varnish curtain 2.

Figure 4:
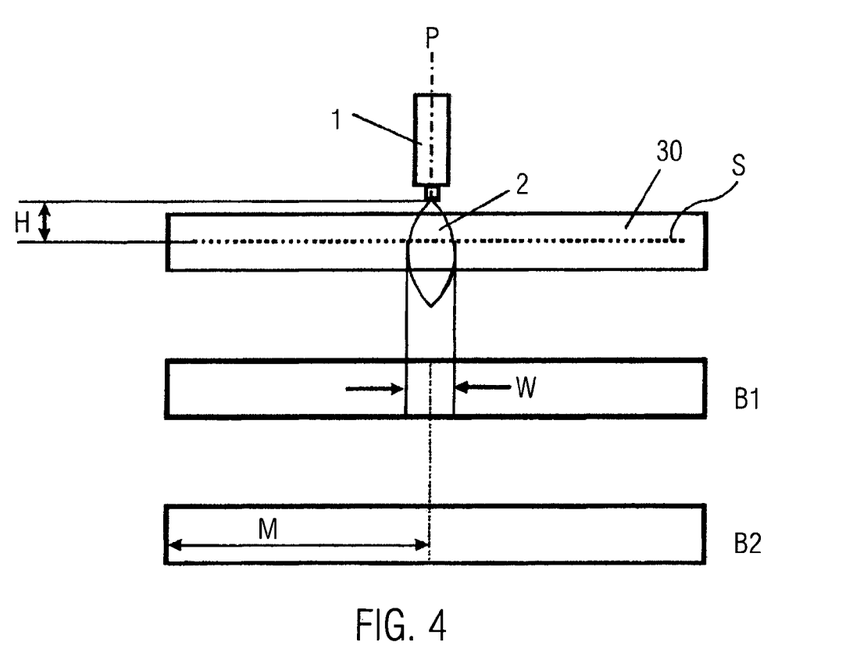
FIG. 4 shows an example of a symmetrical varnish curtain.

FIG. 4 illustrates the measuring principle of this invention. Block 30 illustrates the sensor and blocks B1 and B2 illustrate the operating modes of sensor 30. In operating modes B1 and B2, signals are output on the output 40 shown in FIG. 2, respectively. It is possible to switch between operating modes B1 and B2 via input 50 shown in FIG. 2. In the first operating mode B1, a voltage is output via output 40 which corresponds to the width W of the varnish curtain 2 and which has been detected by sensor 30. For example, if the output is an analog output, it may be designed to output a voltage in the range of 0 to 10 V. In this case, a voltage of 0 V can indicate that there is no varnish curtain 2. In this case, an output voltage of 10 V would mean that the varnish curtain 2 extends over the entire width WS of the field of view S. If, for example, the width WS of the field of view S were 10 cm, in operating mode B1 of the example shown in FIG. 4, the output voltage at the analog output 40 would be 1 V, i.e. the width W of the varnish curtain 2 would be 1 cm. Usually curtain widths from 3 to 20 mm are used. Accordingly, the width WS of the field of view S is designed for approx. 25-30 mm. In future applications, dimensions of less or more than 3 cm are conceivable. In operating mode B2, the center position M of the varnish curtain 2 is determined. In the case of an analogue output, a voltage can be output on the analogue output 40, which corresponds, for example, to the distance of the center position M of the varnish curtain 2 from the edge of the field of view S. This is the same as in the case of the analogue output. If, as in the above example, the width WS of the field of view S is 10 cm and the voltage range of the analogous output signal lies between 0 V and 10 V, a center position M of the varnish curtain 2 in the illustration of FIG. 4 would correspond to an output voltage of approx. 5 V at the analogue output 40. However, other scaling is also possible, for example at an exact center position the output voltage could be 0 V and at a shift of the center position M of the varnish curtain 2 to the left edge of the field of view the output voltage could be −5 V and a shift of the center position M to the right edge of the field of view S the output voltage could be +5 V. The output voltage span of 10 V is not limited to this value either, but can take any value, such as 3 V or 5 V, for example. Digital values can also be output instead of the analog voltages. The two operating modes B1 and B2 can be executed simultaneously with two outputs and their results can be output on the two outputs. If only one output is used, digital input 50 can be used to switch between the two operating modes.

As a rule, the measuring position, i.e. the center position P of the curtain nozzle 1, is set to the center position of the field of view S of the sensor 30. This means that in the above example with analog output, the center position P of the curtain nozzle 1 in the measuring position corresponds to an output voltage of the sensor 30 of 5 V in the second operating mode B2, if 0 V corresponds to the left edge position of the field of view and 10 V corresponds to the right edge position of the field of view S. With exact symmetry of the varnish curtain 2, the output voltage of analog output 40 in second mode B2 must correspond to a fictitious voltage value for the curtain nozzle position corresponding to the center position P of curtain nozzle 1.

Figure 5:
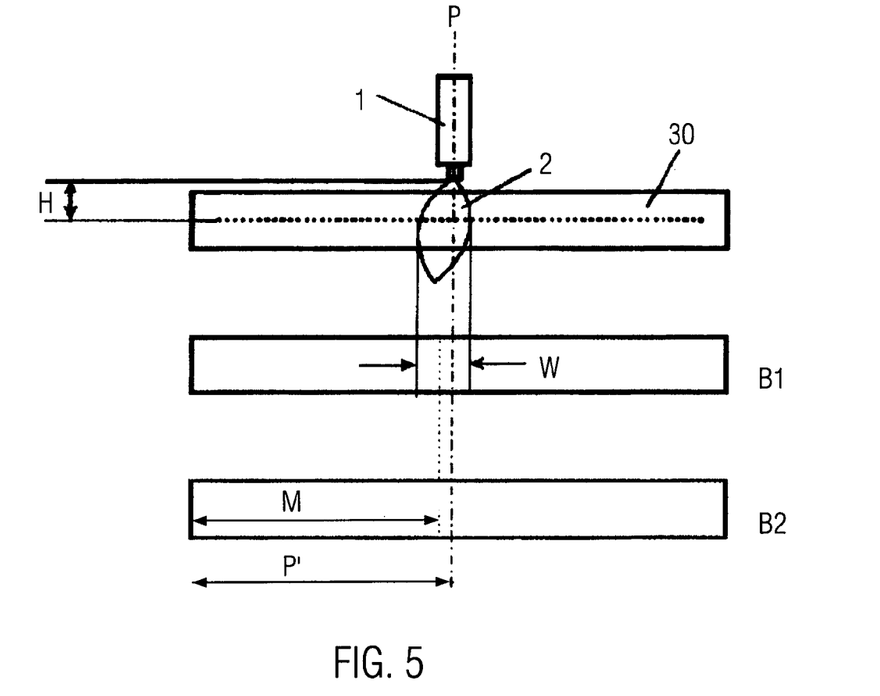
FIG. 5 shows an example of an asymmetrical varnish curtain.

FIG. 5 illustrates the situation with an asymmetry of the varnish curtain 2. In this case, different values result for the coordinate P of the middle position of the curtain nozzle 1, to which a virtual voltage value P' can be assigned, and for the middle position M of the varnish curtain 2. From the difference of the two coordinate values, a correction for the spray pattern during the varnish coating can be calculated. Due to the fixed assignment of the positions of the field of view S and the curtain nozzle 1, each coordinate value within the field of view S of the sensor 30 can be assigned a voltage value at the analog output 40, so that the voltage output at the analog output 40 in operating mode B2 is always related to the position of the curtain nozzle 1 on the Y axis.

Figure 6:
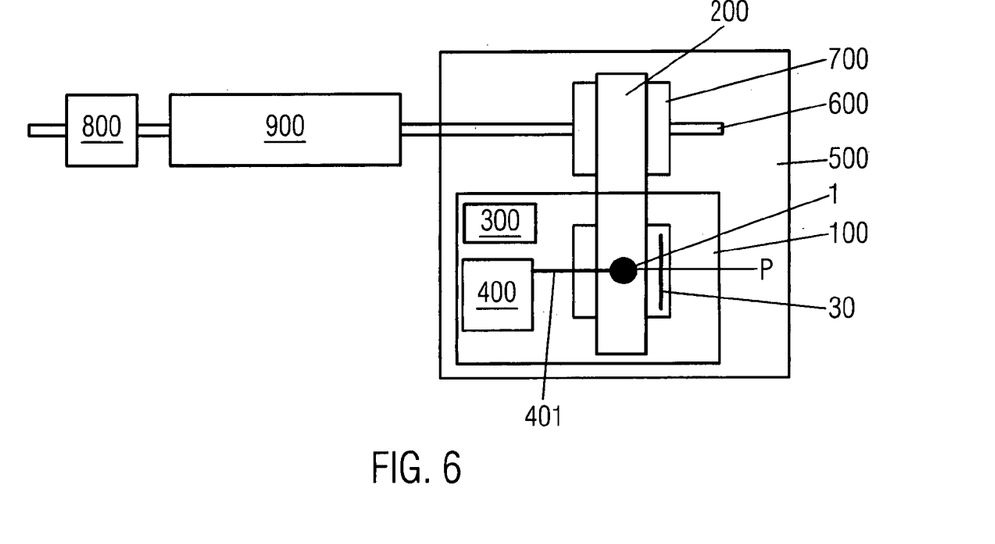
FIG. 6 shows a schematic representation for a partial section of a board production plant.

FIG. 6 schematically shows a circuit board production line with some selected components. Reference numeral 100 designates a measuring device. The reference numeral 200 designates a transport device for a curtain nozzle 1. The reference numeral 300 designates a control system and the reference numeral 400 designates a varnish supply device with pumps and varnish reservoirs. The varnish from the varnish supply device is fed to the curtain nozzle 1 via the supply line 401. In FIG. 6, the curtain nozzle 1 is drawn in a position opposite the sensor 30 in a measuring position P. With the transport device 200 the varnish applicator 1 can be transported from the measuring position P to a varnishing section 700. A board conveyor 600 transports boards between different processing stages, for example from a loading device 800 through an oven 900 to the varnishing section 700. The reference numeral 500 designates a varnishing device for boards.

Figure 7:
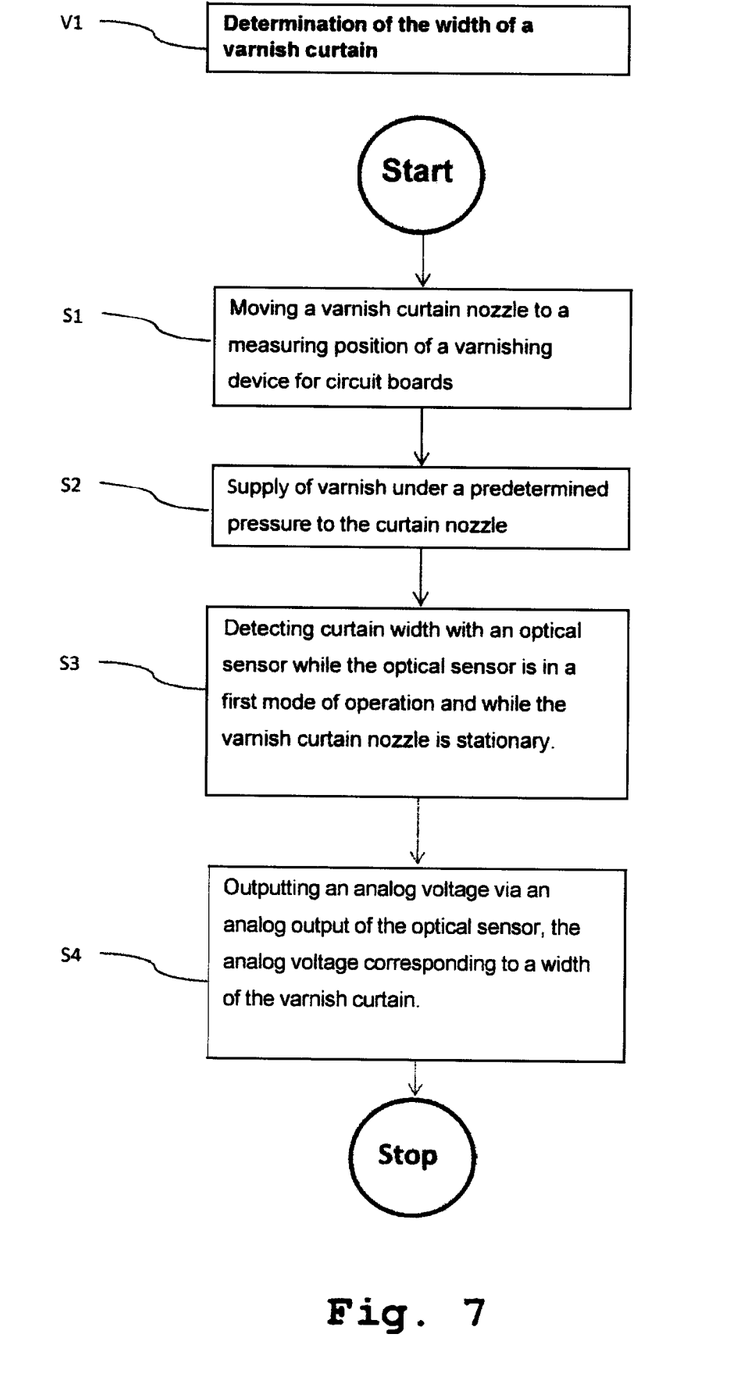
FIG. 7 shows a flowchart of a method for determining the width of a varnish curtain.
Figure 8:
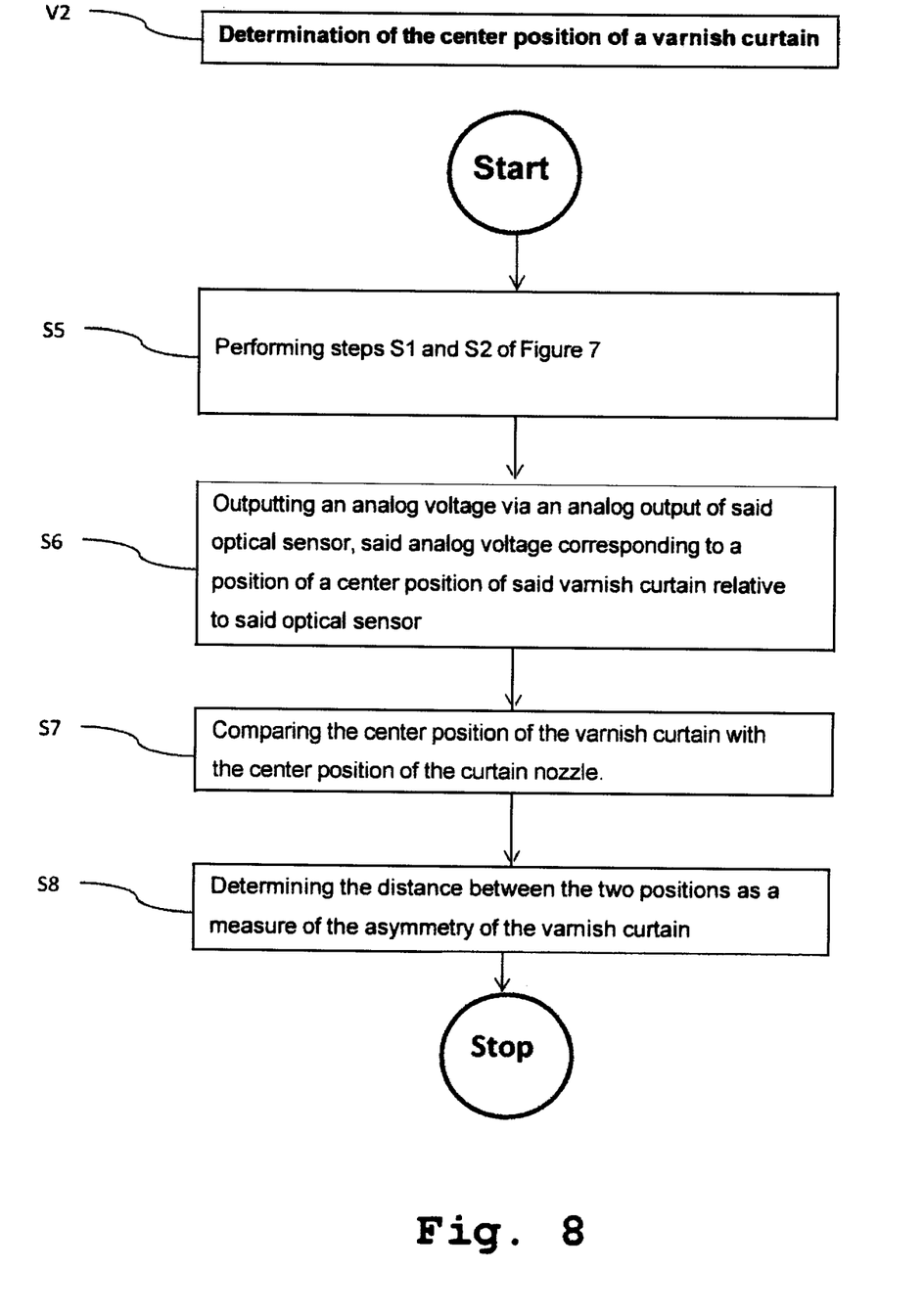
FIG. 8 shows a flow chart of a method for determining the asymmetry of a varnish curtain.

FIGS. 7 to 10 show flow charts for various procedures for using the arrangements and principles described above. FIGS. 7 and 8 illustrate the basic measurement procedures for determining the width and symmetry of a varnish jet. These two methods can be used as building blocks in the methods of FIGS. 9 and 10, or used alone, for example in a width check or a symmetry check, which can be carried out regularly. The procedures are described using the example of the previously described sensor with an analogue output, but are not limited to this. The procedures can be carried out with one or more digital or analog outputs and no or several digital or analog inputs. Furthermore, the described procedures can be combined in any order. The procedures illustrated in the flow diagrams of FIGS. 7 to 10 are only exemplary embodiments which only clarify partial aspects of the attached claims and which must not be regarded as restrictive. The total scope of the invention is defined exclusively by the attached claims.

FIG. 7 illustrates a method for using the previously discussed senor. FIG. 2 shows a method to determine a width of a varnish curtain V1. In step S1, a varnish curtain nozzle is moved to a measuring position of a varnishing device for printed circuit boards. In the next step, S2, varnish is fed to the curtain nozzle under a given pressure. In the next step, S3, the curtain width is detected with the previously described optical sensor 30, while the optical sensor is in a first operating mode and while the varnish curtain nozzle is stationary. In step S4, an analog voltage is output via the analog output 40 of the optical sensor 30, wherein the analog voltage corresponds to the width of the varnish curtain.

FIG. 8 shows a flow chart for a method to determine the center position of a varnish curtain V2. Steps S1 and S2 from FIG. 7 are carried out in step S5. Alternatively, the operating mode could be switched immediately after the procedure in FIG. 7, for example via a digital input 50. In this case, a digital signal can be entered into the digital input 50 of the optical sensor 30 in order to set the optical sensor 30 to a second operating mode B2. With two outputs, this step could be completely omitted. In the next step, S6, an analog voltage is output via an analog output 40 of the optical sensor 30, whereby the analog voltage corresponds to a position of a center layer position M of the varnish curtain 2 relative to the optical sensor 30. In the next step, S7, the position of the center position M of the varnish curtain 2 is compared with the center position P of the curtain nozzle 1 at the measurement position. As described above, the center position P of the curtain nozzle relative to sensor 30 is known and can be stored as a virtual voltage signal in a device control, for example. The measured voltage value for the center position M of the varnish curtain 2 is output as an analog signal at analog output 40. This output value can be compared with the stored virtual voltage value P', which defines the position of the curtain nozzle relative to the field of view S of the sensor 30. In the next step S8, a distance between the two positions is determined as a measure of the asymmetry of the varnish curtain.

Figure 9:
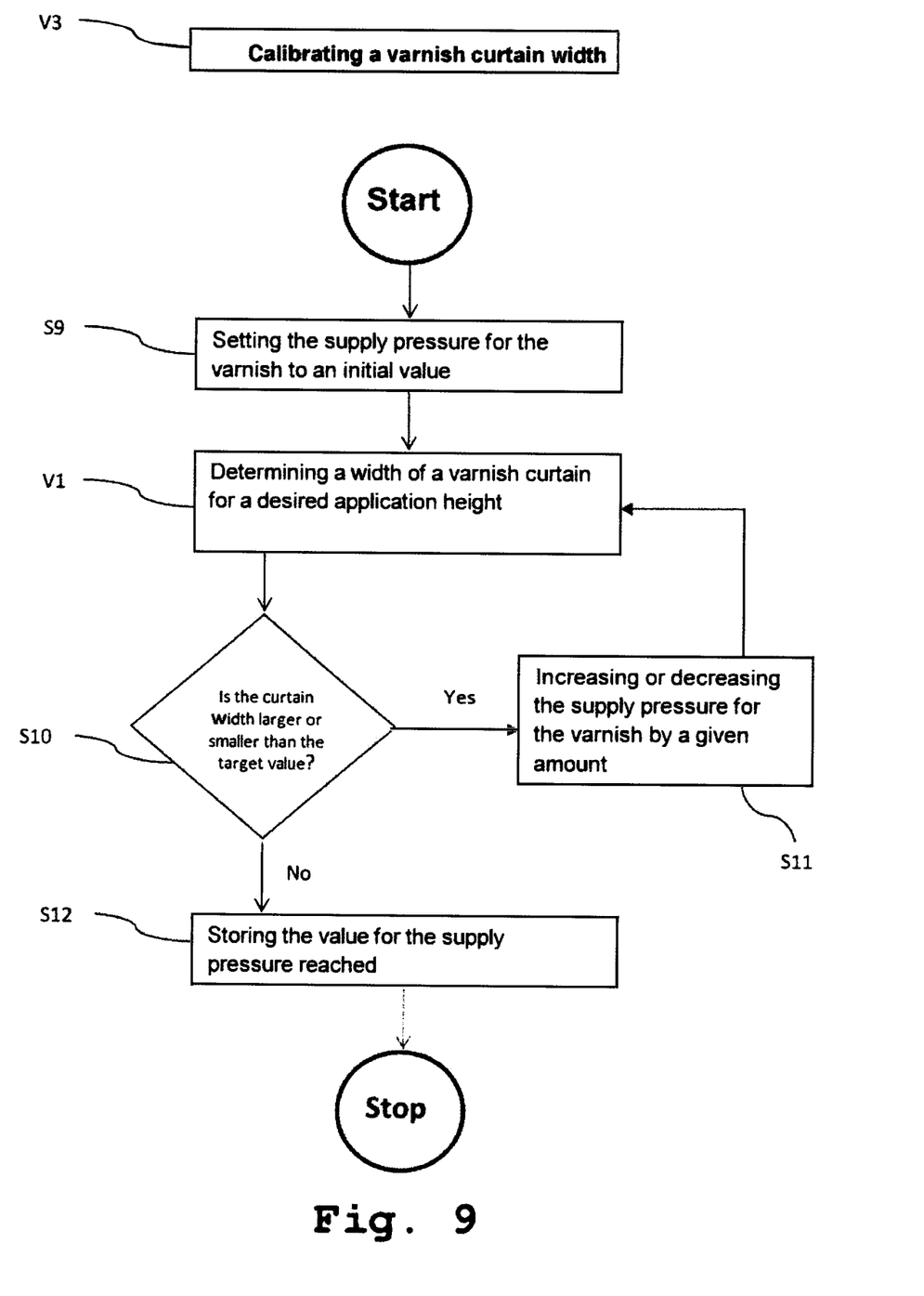
FIG. 9 shows a flowchart for a method of measuring a width of a varnish curtain.

FIG. 9 shows a flow chart for a method V3 for measuring a curtain width. In step S9, the supply pressure for the varnish is set to an initial value. In the next step, the procedure V1 described in FIG. 7 is carried out with steps S1 to S4. In step S10, the measured curtain width is compared with a nominal value. If the measured curtain width is smaller than the nominal value, the supply pressure for the varnish is increased by a preset amount in step S11. Conversely, if the measured curtain width is greater than the nominal value, the supply pressure for the varnish is reduced by a specified amount in step S11. Then it is continued with procedure V1 with steps S1 to S4. If the measured curtain width corresponds to the nominal value, the value for the supply pressure reached is stored in step S12.

Figure 10:
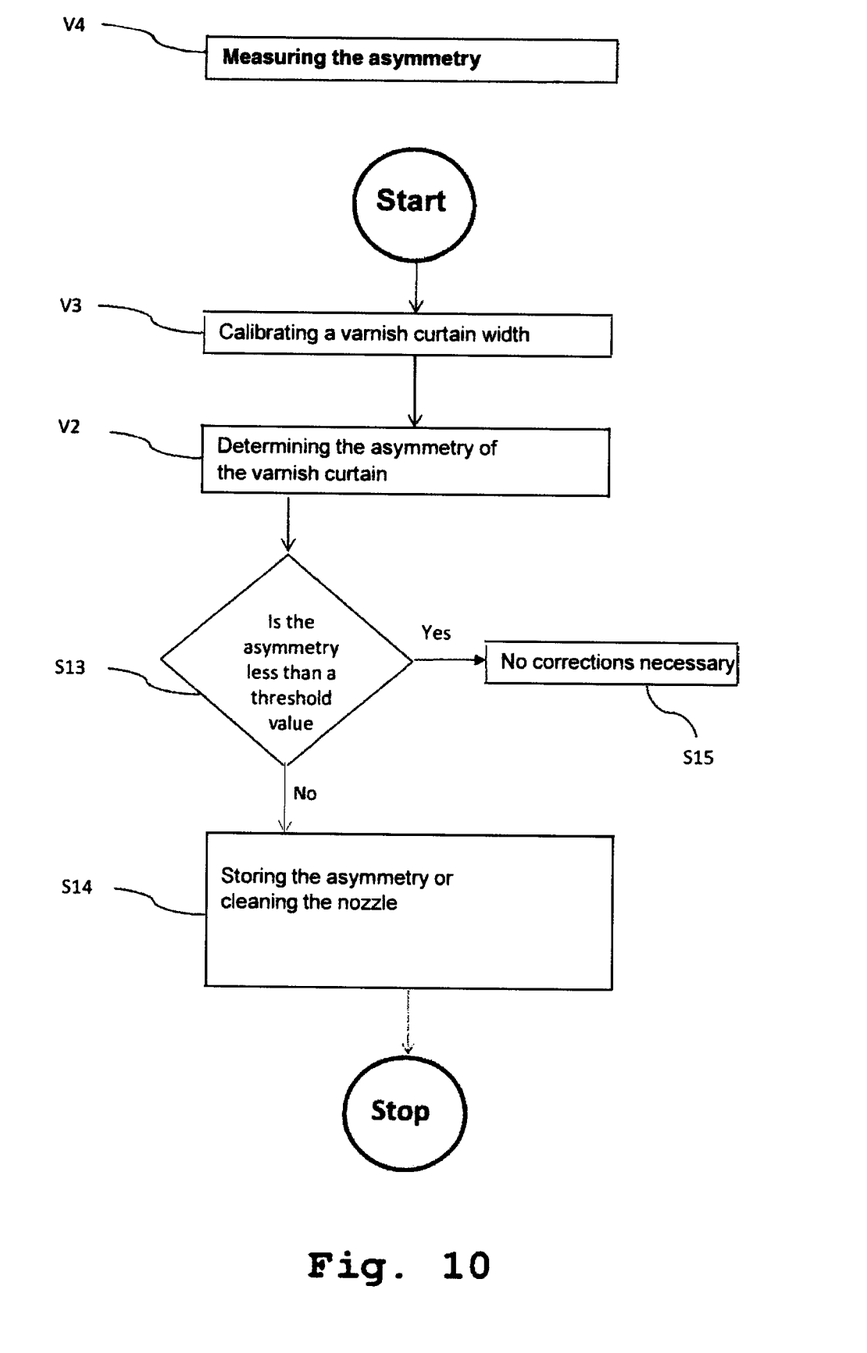
FIG. 10 shows flowchart for a method of measuring the asymmetry of a varnish curtain.

FIG. 10 shows a flow chart V4 for a procedure for measuring a curtain width. This procedure can optionally be carried out following the procedure V3 of FIG. 9. Then the asymmetry is carried out according to the procedure V2 of FIG. 8. In step S13 the measured asymmetry is compared with a threshold value. If the asymmetry value is smaller than a first threshold value, no corrections, box S15, are necessary. If the asymmetry value is greater than a first threshold value, corrections are made in the varnishing plan with the asymmetry value. If the asymmetry value is greater than a second threshold value, the nozzle can be cleaned, step S14. Although FIG. 10 describes a procedure in which the procedure V3 of FIG. 9 is carried out in the first step, the procedure can also be carried out without this step. This latter procedure can then be carried out as the first step in the procedure according to FIG. 9. I.e., in the measuring process the symmetry can be determined before the width is determined.

After the parameters for the desired curtain width in the desired application height, i.e. the required pressure values, as well as the asymmetry of the varnish curtain are known, in the next step the machine control can calculate or adapt a program for a spray pattern for varnishing the boards and then carry out the coating process.

What is claimed is:

1. Optical sensor adapted to measure a varnish jet for a varnishing process, the optical sensor comprising:
   a field of view having a width extension greater than the maximum expected width of the varnish jet so that the sensor does not need to be moved relative to the varnish jet during a measurement operation;
   at least one output via which a signal can be output which corresponds to a position of a central position of the varnish jet relative to the optical sensor; and
   means for determining asymmetry of the varnish jet.

2. Optical sensor according to claim 1, wherein the optical sensor has at least two outputs, wherein on the first of the at least two outputs a signal can be output which corresponds to the width of the varnish jet in the field of view of the optical sensor and on the second of the at least two outputs a signal can be output which corresponds to the position of the center position of the varnish jet relative to the optical sensor.

3. Optical sensor according to claim 2, wherein the width extension of the field of view of the optical sensor is in the range between 4 cm and 1 cm.

4. Optical sensor according to claim 1, wherein the optical sensor uses light in a wavelength range of 650 nm to 780 nm.

5. Measuring device comprising:
   the optical sensor according to claim 1;
   a positioning device adapted to position a varnish applicator for varnishing circuit boards with a protective varnish; and
   control means configured to control the positioning device such that the varnish applicator is conveyed to a predetermined measuring position such that a varnish exit from a nozzle orifice in the varnish applicator is positioned at a predetermined application height above the field of view of the sensor, and a varnish jet width and/or a varnish jet symmetry of the varnish jet can be measured at the predetermined application height.

6. Measuring device according to claim 5, wherein the measuring device further comprises a varnish supply means for the varnish applicator, and
   wherein the control means is further configured to drive the varnish supply means so that the varnish jet width and/or the varnish jet symmetry of the varnish jet can be determined at a particular supply pressure for the varnish.

7. Varnishing device (500) for circuit boards comprising:
   a measuring device according to claim 6,
   a circuit board conveyor; and
   a varnishing section in which the circuit boards can be varnished,
   wherein the positioning device of the measuring device being further configured to position the varnish applicator in the varnishing section and to move it in the varnishing section so that the circuit board is varnished, and
   wherein the control means of the measuring device is further configured to control the positioning device and the varnish supply means for a varnishing operation using the measured varnish jet width and/or varnish jet symmetry.

8. Method for determining a symmetry of a varnish jet for varnishing circuit boards comprising:
   moving a varnish applicator to a measuring position of a varnishing device for printed circuit boards;
   supplying varnish under a predetermined pressure to the varnish applicator;
   detecting, with an optical sensor according to claim 1, a center position of the varnish jet relative to the optical sensor while the varnish applicator is stationary;
   outputting a signal corresponding to a position of a center position of the varnish jet relative to the optical sensor;
   comparing the position of the center position of the varnish jet with the center position of a nozzle orifice on the varnish applicator; and
   determining the distance of the two positions as a measure of the asymmetry of a varnish curtain.

9. Method according to claim 1, wherein the varnish applicator is positioned at the measuring position such that a varnish outlet from a nozzle orifice in the varnish applicator is positioned at a predetermined application height above a field of view of the sensor, and a varnish jet width and/or a jet symmetry of the varnish jet can be measured at the predetermined application height.

10. Method of measuring a varnish jet comprising the steps of:
    determining the asymmetry of the varnish jet according to claim 8; and
    storing the asymmetry in the form of a value for an offset between the position of the center position of the varnish jet and the center position of the nozzle orifice on the varnish applicator.

11. Method according to claim 10 which further comprises the following steps:
    comparing the distance between the center position of the varnish curtain and the center position of the nozzle orifice on the varnish applicator to a second threshold;
    positioning the varnish applicator in a cleaning position and performing a cleaning when the threshold is exceeded.

12. Method for measuring a varnish jet comprising the steps of:
    determining the asymmetry of the varnish jet according to claim 8;
    comparing the distance between the position of the center position of the varnish jet and the center position of the nozzle orifice on the varnish applicator with a first threshold; and
    storing the asymmetry in the form of a value for offset between the center position of the varnish jet and the center position of the nozzle orifice on the varnish applicator when the first threshold is exceeded.

13. Method according to claim 12 which further comprises the following steps:

comparing the distance between the center position of the varnish curtain and the center position of the nozzle orifice on the varnish applicator to a second threshold;

positioning the varnish applicator in a cleaning position and performing a cleaning when the threshold is exceeded.

14. Optical sensor according to claim 1 wherein:
said means is coupled to said at least one output.

15. Method for determining a symmetry of a varnish jet for varnishing circuit boards comprising:

moving a varnish applicator to a measuring position of a varnishing device for printed circuit boards;

supplying varnish under a predetermined pressure to the varnish applicator;

detecting a center position of the varnish jet relative to an optical sensor while the varnish applicator is stationary, the optical sensor comprising, a field of view having a width extension greater than the maximum expected width of the varnish jet so that the optical sensor does not need to be moved relative to the varnish jet during a measurement operation, and at least one output via which a signal can be output which corresponds to a width of the varnish jet in the field of view of the optical sensor;

outputting a second signal corresponding to a position of a center position of the varnish jet relative to the optical sensor;

comparing the position of the center position of the varnish jet with the center position of a nozzle orifice on the varnish applicator; and determining the distance of the two positions as a measure of the asymmetry of a varnish curtain.

16. Method for determining a symmetry of a varnish jet for varnishing circuit boards comprising:

moving a varnish applicator to a measuring position of a varnishing device for printed circuit boards;

supplying varnish under a predetermined pressure to the varnish applicator;

detecting a center position of the varnish jet relative to an optical sensor while the varnish applicator is stationary;

comparing the position of the center position of the varnish jet with a center position of a nozzle orifice on the varnish applicator; and determining the distance of the two positions as a measure of the asymmetry of a varnish curtain.

* * * * *